United States Patent
Brennan et al.

(10) Patent No.: US 6,787,875 B2
(45) Date of Patent: Sep. 7, 2004

(54) SELF-ALIGNED VIAS IN AN INTEGRATED CIRCUIT STRUCTURE

(75) Inventors: Kenneth D. Brennan, Austin, TX (US); Paul M. Gillespie, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/212,419

(22) Filed: Aug. 5, 2002

(65) Prior Publication Data

US 2004/0021196 A1 Feb. 5, 2004

(51) Int. Cl.⁷ ................................................ H01L 29/72
(52) U.S. Cl. ........................ 257/508; 257/509; 257/511; 257/513; 438/694; 438/702; 438/737
(58) Field of Search ................................ 257/508, 509, 257/511, 513; 438/694, 702, 737

(56) References Cited

U.S. PATENT DOCUMENTS

2003/0003603 A1 * 1/2003 Chaudhry et al. .......... 257/508

* cited by examiner

*Primary Examiner*—Edward Wojciechowicz
(74) *Attorney, Agent, or Firm*—Jacqueline J. Garner; W. James Brady, III; Frederick J. Telecky, Jr.

(57) ABSTRACT

A method of forming a via in an integrated circuit is provided. The method includes forming a stack including a first layer, a hard mask layer, and at least one intermediate layer disposed between the first layer and the hard mask layer. The first layer comprises a first metal line. The method further includes forming a channel in the hard mask layer. The channel has a first side and a second side opposite the first side. The method further includes forming a resist layer having an opening extending over both the first and second sides of the channel. The method further includes forming a metal line trench and a via opening aligned with the first and second sides of the channel. The method further includes filling the filling the metal line trench and the via opening with a conductive material to create a second metal line and a via connecting the second metal line with the first metal line.

16 Claims, 4 Drawing Sheets

SELF-ALIGNED VIAS IN AN INTEGRATED CIRCUIT STRUCTURE

TECHNICAL FIELD OF THE INVENTION

This invention relates in general to integrated circuits and, more particularly, to self-aligned vias in an integrated circuit structure.

BACKGROUND OF THE INVENTION

Interconnects are often formed in integrated circuit fabrication to connect particular elements or components of the integrated circuit and may be used, for example, to create an electrical path within an integrated circuit, such as to apply a voltage to a particular region or component of the integrated circuit. Interconnects may include one or more metal lines or wires and one or more vias. Metal lines may be formed in various structural layers called metalization layers and conductive vias may be formed to connect particular elements formed in various metalization layers. For example, conductive vias are often used to connect metal lines formed in one metalization layer with metal lines formed in other metalization layers.

Metal lines and vias may be formed using standard or damascene processes, such as single and dual damascene processes. In a standard process, metal lines are formed by depositing and etching away portions of a metal layer. In contrast, in a damascene process, metal lines are deposited in trenches formed in a dielectric layer and then excess material is removed, for example, by chemical metal polish (CMP).

SUMMARY OF THE INVENTION

In accordance with the present invention, a self-aligned via in an integrated circuit is provided that substantially eliminates or reduces the disadvantages and problems associated with previously-developed vias.

According to one embodiment, a method of forming a via in an integrated circuit is provided. The method includes forming a stack including a first layer, a hard mask layer, and at least one intermediate layer disposed between the first layer and the hard mask layer. The first layer comprises a first metal line. The method further includes forming a channel in the hard mask layer. The channel has a first side and a second side opposite the first side. The method further includes forming a resist layer having an opening extending over both the first and second sides of the channel. The method further includes forming a metal line trench and a via opening aligned with the first and second sides of the channel. The method further includes filling the metal line trench and the via opening with a conductive material to create a second metal line and a via connecting the second metal line with the first metal line.

According to another embodiment, a semiconductor apparatus is provided. The semiconductor apparatus includes a first layer, a second layer, and at least one intermediate layer disposed between the first layer and the hard mask layer. A first metal line is disposed in the first layer. A second metal line is disposed in a trench formed in the second layer. The trench has a first side and a second side opposite the first side. The semiconductor apparatus further includes a via connecting the first metal line with the second metal line. The via is formed such that it is self-aligned with the first and second sides of the trench.

Various embodiments of the present invention may benefit from numerous technical advantages. It should be noted that one or more embodiments may benefit from some, none, or all of the advantages discussed below.

One technical advantage of the invention is that a via connecting a first metal line with a second metal line may be self-aligned with the second metal line. Thus, the contact area between the via and the second metal line is equal to the entire cross-sectional area of the via, which may allow a desirable electrical contact between the via and the second metal line. In addition, the via has a relatively large contact area with the first metal line as compared with other methods of forming vias and metal lines. The via may have a larger contact area with the first metal line than a via formed using other fabrication methods, including other trench-first and via-first methods.

Another technical advantage is that vias and metal lines may be formed having desirable or increased spacing between adjacent vias and metal lines. This spacing may be greater than the spacing provided by prior trench-first fabrication methods, and may reduce or eliminate undesirable effects such as shorting or leakage current, for example.

Other technical advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Example embodiments of the present invention and their advantages are best understood by referring now to FIGS. 1 through 6 of the drawings, in which like numerals refer to like parts.

In general, a method of forming self-aligned vias in an integrated circuit structure is provided. The vias may be used to connect elements, such as metal lines, disposed in various layers of the integrated circuit structure. For example, the vias may connect metal lines formed in different layers of a single damascene or dual damascene stack. In some embodiments, a trench for receiving a second metal line is formed generally above a first metal line, and a via connecting the second metal line with the first metal line is formed such that the via is self-aligned with the channel, and thus with the second metal line. In this manner, a via having a large contact area between both the first and second metal lines may be formed.

Figure 1:
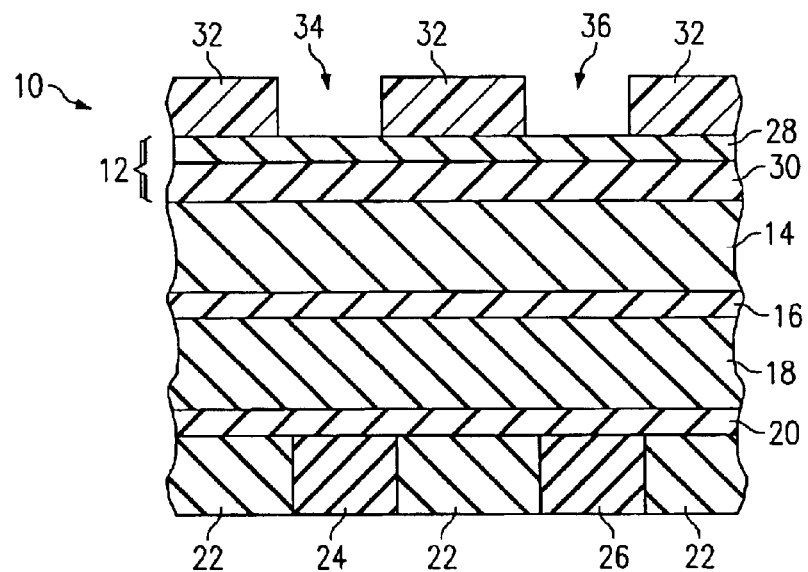
FIG. 1 is a partial cross-sectional view of a damascene stack including a resist layer used to form two channels in a top layer of a hard mask in accordance with an embodiment of the present invention.

FIGS. 1–5A illustrate example methods of forming a self-aligned via in accordance with several embodiments of the present invention. As shown in FIG. 1, a dual damascene stack 10 includes a hard mask 12, a first dielectric layer 14, a trench etch stop layer 16, a second dielectric layer 18, a via etch stop layer 20, and a first metalization layer 22. First metalization layer 22 may include metal lines 24 and 26.

In the embodiment shown in FIG. 1, hard mask 12 comprises a first layer 28 and a second layer 30 and may be referred to as a dual hard mask. In one embodiment, first layer 28 of hard mask 12 comprises silicon carbide and second layer 30 of hard mask 12 comprises a solid, low-k dielectric, such as a dielectric having a value of k less than 3.0. In other embodiments, hard mask 12 may comprise any suitable number of layers and may comprise any materials suitable to form a hard mask.

First dielectric layer 14 and/or second dielectric layer 18 may comprise one or more low-k dielectric materials. For example, in one embodiment, first dielectric layer 14 and second dielectric layer 18 comprise a porous dielectric material having a value of k less than 2.5.

A photoresist layer 32 may be deposited and patterned as shown in FIG. 1. Openings 34 and 36 may be formed in photoresist layer 32 in order to form channels in hard mask 12, such as described below with reference to FIG. 2. Openings 34 and 36 may be intended to be aligned with metal lines 24 and 26, respectively, but may actually be misaligned by some amount due to imprecision in various fabrication processes, as described below with reference to FIGS. 2A and 5A.

Figure 2:
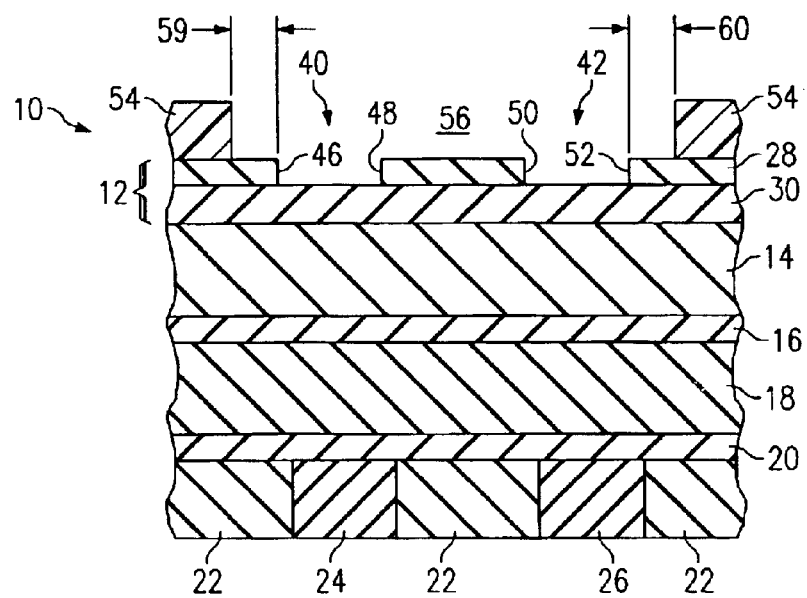
FIG. 2 is a partial cross-sectional view of the damascene stack of FIG. 1, illustrating the two channels formed in the hard mask and a resist layer used to form vias self-aligned with each channel.
Figure 2A:
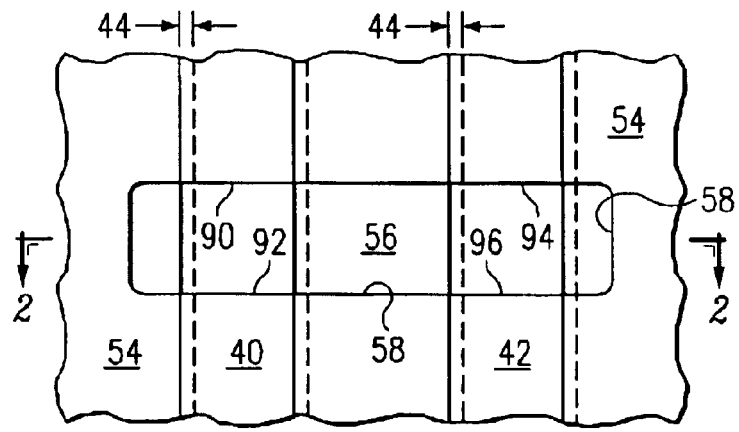
FIG. 2A is a partial top view of the damascene stack of FIG. 2, illustrating a pattern formed in the resist layer including an opening extending over both channels in accordance with an embodiment of the present invention.

As shown in FIG. 2, trench patterns, or channels, 40 and 42 may be formed in first layer 28 of hard mask 12. Channels 40 and 42 may be formed by etching through openings 34 and 36 in photoresist layer 32 as shown in FIG. 1. As shown in FIG. 2A, channels 40 and 42 may be misaligned with metal lines 24 and 26, respectively, by a particular distance 44. Such misalignment may be due to the inaccuracy and/or misalignment inherent in various photolithography processes, such as masking and patterning. Channel 40 may include a first wall 46 and a second wall 48 opposite first wall 46, and channel 42 may include a first wall 50 and a second wall 52 opposite first wall 50.

As shown in FIGS. 2 and 2A, a photoresist layer 54 may be formed adjacent hard mask 12. An opening 56 defined by an edge 58 may be formed in photoresist layer 54 that extends completely across the width of channels 40 and 42. In some embodiments, opening 56 is formed wider than would be necessary to cover channels 40 and 42 in order to account for possible misalignment of opening 56. For example, in one embodiment in which opening 56 is intended to be aligned with channels 40 and 42, opening 56 is formed such that if perfectly aligned with channels 40 and 42, opening 56 would extend beyond first wall 46 of channel 40 by a first distance 59 and beyond second wall 52 of channel 42 by a second distance 60. This provides a margin of error for aligning opening 56 with channels 40 and 42 in order to ensure, or at least increase the likelihood, that opening 56 will extend across first wall 46 of channel 40 and second wall 52 of channel 42. In another embodiment in which opening 56 is intended to be aligned with metal lines 24 and 26, opening 56 may be sized to extend beyond metal lines 24 and 26 to account for the possible misalignment of opening 56 with metal lines 24 and 26 as well as possible misalignment of channels 40 and 42 with metal lines 24 and 26, respectively.

Figure 2B:
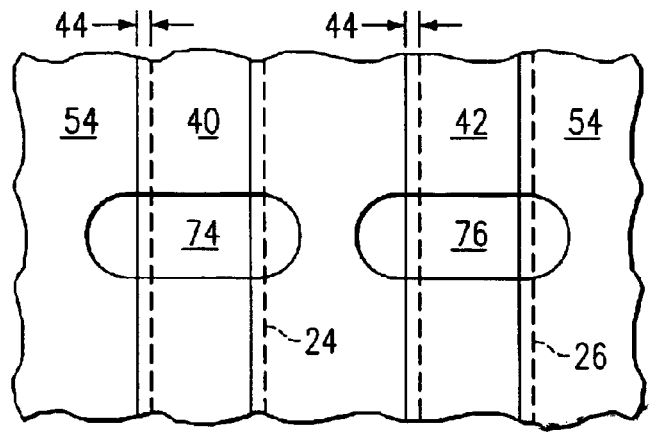
FIG. 2B is a partial top view of a damascene stack in accordance with another embodiment of the present invention, illustrating a pattern formed in the resist layer including a separate opening extending over each channel.

FIG. 2B illustrates an alternative pattern formed in photoresist layer 54 in accordance with another embodiment of the present invention. In this embodiment, photoresist layer 54 includes separate openings 74 and 76 extending across channels 40 and 42, respectively. Similar to opening 56 discussed above, openings 74 and 76 are formed wider than would be necessary to cover channels 40 and 42 in order to account for possible misalignment of openings 74 and 76. For example, in one embodiment in which opening 56 is intended to be aligned with channels 40 and 42, openings 74 and 76 are formed such that if accurately aligned with channels 40 and 42, opening 74 would extend beyond first and second walls 46 and 48 of channel 40 and opening 76 would extend beyond first and second walls 50 and 52 of channel 40 by one or more predetermined distances. This provides a margin of error for aligning openings 74 and 76 with channels 40 and 42 in order to ensure, or at least increase the likelihood, that openings 74 and 76 will extend across channels 40 and 42, respectively. In another embodiment in which openings 74 and 76 are intended to be aligned with metal lines 24 and 26, openings 74 and 76 may be sized to extend beyond the width of metal lines 24 and 26 to account for the possible misalignment of openings 74 and 76 with metal lines 24 and 26 as well as possible misalignment of channels 40 and 42 with metal lines 24 and 26, respectively.

Figure 3:
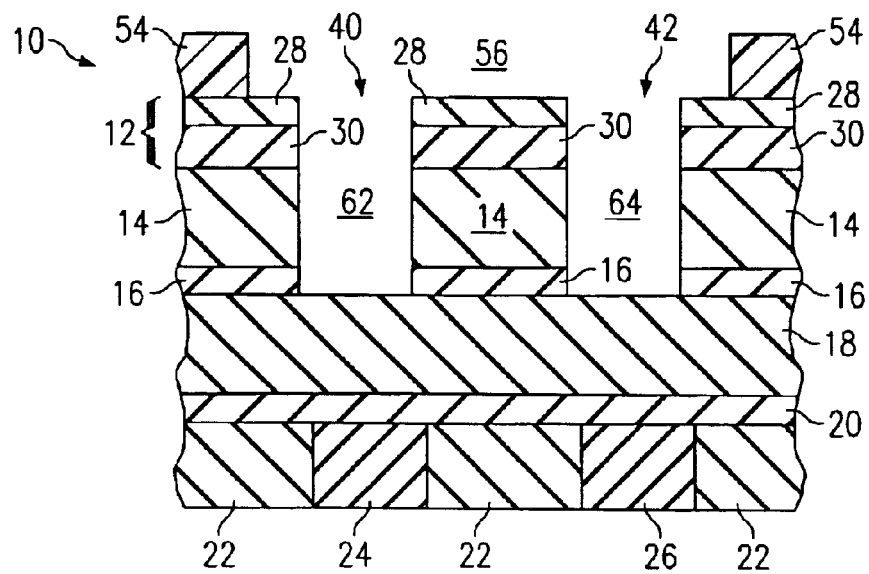
FIG. 3 is a partial cross-sectional view of the damascene stack of FIG. 1, illustrating via opening pilots formed in the stack and self-aligned with the channels.

As shown in FIG. 3, via opening pilots 62 and 64 may be formed in stack 10 by etching through the portions of channels 40 and 42 within opening 56 in photoresist layer 54. One or more different etch processes or etch chemistries may be used to etch through second layer 30 of hard mask 12, first dielectric layer 14, and trench etch stop layer 16. For example, in one embodiment, a separate anisotropic etch process is performed to remove the relevant portions of each layer 12, 14 and 16.

Each etch process used to etch through second layer 30 of hard mask 12, first dielectric layer 14, and trench etch stop layer 16 may be selective to first layer 28 of hard mask 12 such that first layer 28 of hard mask 12 is not removed by the etch processes. Thus, first layer 28 of hard mask 12 may be kept intact as a pattern for each subsequent etch processes.

Figure 4:
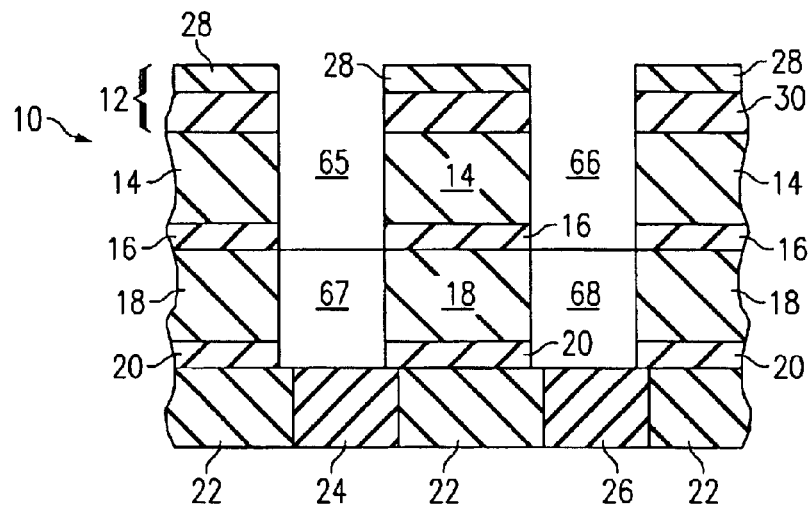
FIG. 4 is a partial cross-sectional view of the damascene stack of FIG. 1, illustrating trenches and self-aligned via openings formed in the stack.

As shown in FIG. 4, photoresist layer 54 is removed and one or more etch processes are performed through channels 40 and 42 to form trenches 65 and 66 and via openings 67 and 68. In one embodiment, a first etch process is performed to simultaneously etch through portions of first dielectric layer 14 on either side of via opening pilots 62 and 64 and the portions of second dielectric layer 18 below via openings 67 and 68. A second etch process is then performed to simultaneously etch through portions of trench etch stop layer 16 on either side of via opening pilots 62 and 64 and the portions of via etch stop layer 20 below via openings 67 and 68. One or more different etch processes or etch chemistries may be used to etch through the relevant portions of dielectric layers 14 and 18 and etch stop layers 16 and 22.

Each etch process used to etch through the relevant portions of dielectric layers 14 and 18 and etch stop layers 16 and 22 may be selective to first layer 28 of hard mask 12 such that first layer 28 of hard mask 12 is not removed by the etch processes. Thus, first layer 28 of hard mask 12 may be kept intact as a pattern for each subsequent etch processes.

Figure 5:
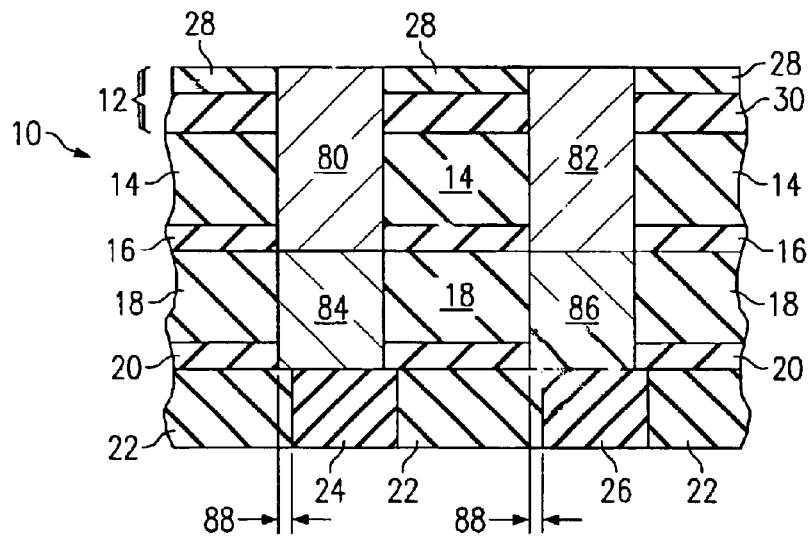
FIG. 5 is a partial cross-sectional view of the damascene stack of FIG. 1, illustrating metal lines formed in the trenches and vias formed in the self-aligned via openings.

As shown in FIG. 5, trenches 65 and 66 and via openings 67 and 68 are filled with one or more conductive materials to form metal lines 80 and 82 and vias 84 and 86. In some embodiments, metal lines 80 and 82 are formed in an adjacent metalization layer as metal lines 24 and 26. In such embodiments, metal lines 80 and 82 are formed in any particular metal layer M and metal lines 24 and 26 are formed in any metal layer M−1.

Via 84 provides an electrical connection between metal line 80 and metal line 24, and via 86 provides an electrical connection between metal line 82 and metal line 26. Metal lines 80 and 82 and vias 84 and 86 may be formed from any suitable conductive material, such as copper or aluminum, for example.

Figure 5A:
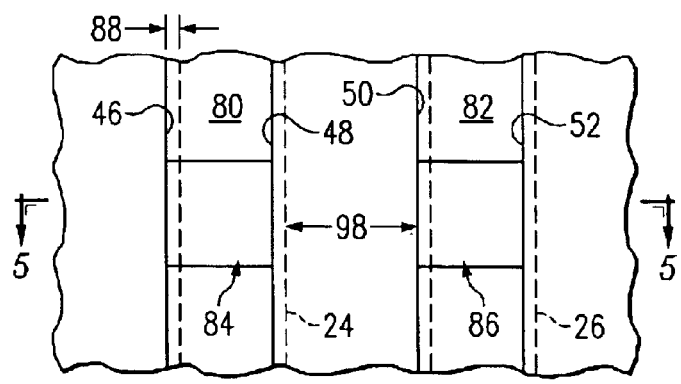
FIG. 5A is a partial top view of the damascene stack of FIG. 5, illustrating the alignment of the vias and metal lines formed in the damascene stack.

By etching through channels 40 and 42 to create via openings 62 and 64, vias 84 and 86 are self-aligned with trenches 65 and 66, and thus with metal lines 80 and 82. As shown in FIG. 5A, via 84 is defined in part by first wall 46 and second wall 48 of channel 40 and portions 90 and 92 of the edge 58 of opening 56 (see FIG. 2A). Similarly, via 86 is defined in part by first wall 50 and second wall 52 of channel 42 and portions 94 and 96 of the edge 58 of opening 56 (see FIG. 2A).

Since vias 84 and 86 are self-aligned with trenches 65 and 66, the amount of misalignment, if any, of vias 84 and 86 with metal lines 24 and 26 is limited to the amount of misalignment of trenches 65 and 66 with metal lines 24 and 26. For example, as shown in FIGS. 5 and 5A, if trenches 65 and 66 are misaligned with metal lines 24 and 26 by a particular distance 88, vias 84 and 86 will be misaligned with metal lines 24 and 26 by the same or approximately the same distance.

In some embodiments, because vias 84 and 86 are self-aligned with metal lines 80 and 82, the contact area between each via 84 and 86 and its respective metal line 80 and 82 is equal to the entire cross-sectional area of each via 84 and 86. In addition, vias 84 and 86 have a relatively large contact area with metal lines 24 and 26 as compared with other methods of forming vias and metal lines. For example, vias 84 and 86 formed according to the methods described above may have a larger average contact area with metal lines 24 and 26 than vias formed using other fabrication methods, including other trench-first and via-first methods.

In addition, the methods described above may be used to provide desired spacing between adjacent vias and metal lines. Such spacing may be important for reducing or eliminating undesirable effects such as shorting or leakage current, for example. For example, as shown in FIG. 5A, forming vias 84 and 86 that are self-aligned with metal lines 80 and 82, respectively, provides a distance of separation 98 between metal line 24 and via 86. Separation 98 may be greater than the separation provided by vias formed using other fabrication methods.

Figure 6:
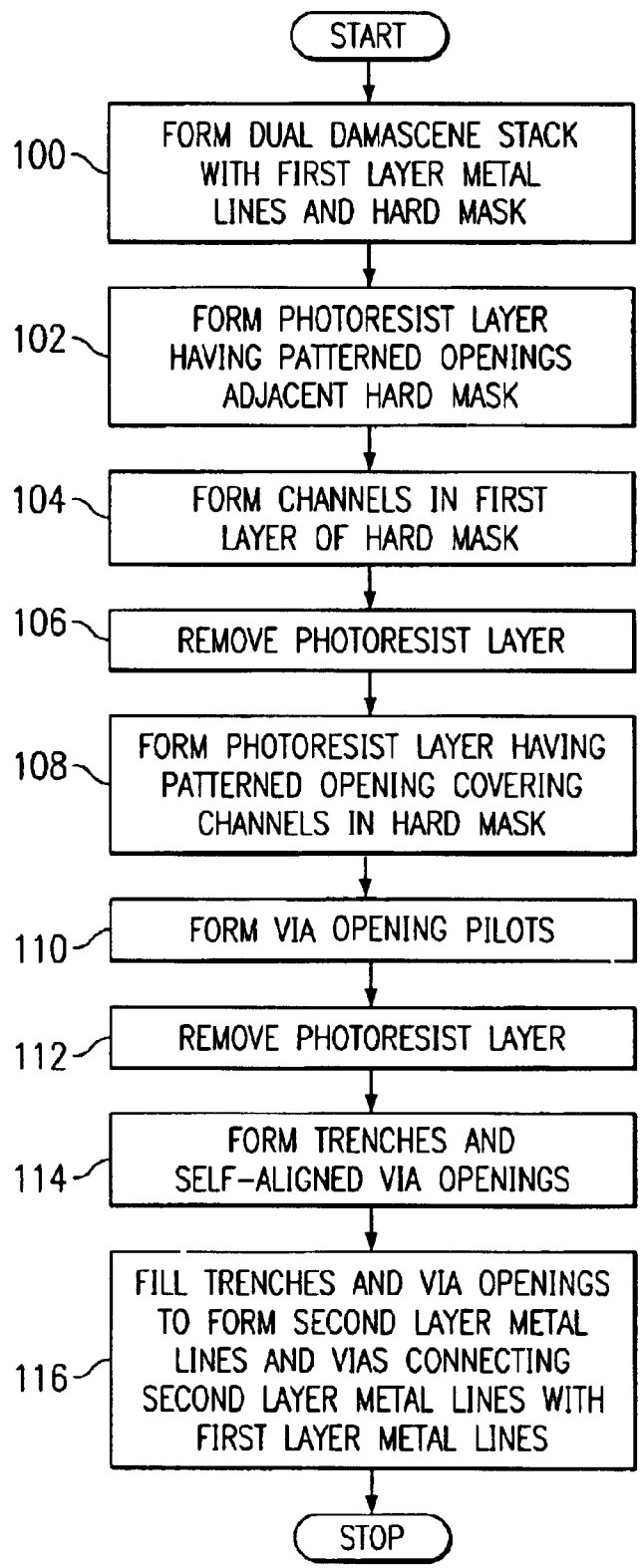
FIG. 6 is a flow chart illustrating a method of forming self-aligned vias according to the embodiments shown in FIGS. 1 through 5A.

FIG. 6 is a flow chart illustrating steps in a method of forming self-aligned vias in accordance with an embodiment of the present invention. At step 100, a dual damascene stack (for example, stack 10) is formed including metal lines (for example, metal lines 24 and 26) disposed in first metalization layer (for example, layer 22). At step 102, a photoresist layer (for example, layer 32) having openings (for example, openings 34 and 36) is formed adjacent a first layer of a hard mask (for example, first layer 28 of hard mask 12). At step 104, one or more etch processes are performed through the openings of the photoresist layer to form trench patterns or channels (for example, channels 40 and 42) in the first layer of the hard mask. At step 106, the photoresist layer is removed.

At step 108, a second photoresist layer (for example, layer 54) having an opening (for example, opening 56) is formed adjacent the hard mask. In some embodiments, this opening extends beyond the channels in order to account for potential misalignment of the opening and/or the channels.

At step 110, one or more etch processes are performed through portions of the channels within the opening in the second photoresist layer to form via opening pilots (for example, via opening pilots 62 and 64). Each via opening pilot is thus self-aligned with one of the channels. Each etch process performed at step 110 may be selective to the first layer of the hard mask (for example, first layer 28 of hard mask 12) such that the first layer of the hard mask is not removed by the etch processes. Thus, the first layer of the hard mask may be kept intact as a pattern for subsequent etch processes.

At step 112, the second photoresist layer is removed. At step 114, one or more etch processes are performed through the channels to form trenches and via openings (for example, trenches 65 and 66 and via openings 67 and 68). Each via openings is thus self-aligned with one of the trenches. Each etch process performed at step 114 may be selective to the first layer of the hard mask such that the first layer of the hard mask is not removed by the etch processes. Thus, the first layer of the hard mask may be kept intact as a pattern for each subsequent etch processes.

At step 116, the trenches and via openings are filled to form metal lines and vias (for example, metal lines 80 and 82 and vias 84 and 86). Each via is thus self-aligned with one of the metal lines. In some embodiments, step 116 includes depositing a barrier layer in the via openings and trenches, filling the via openings and trenches with one or more conductive materials, and polishing the surface of the stack to remove excess materials. For example, a chemical metal polish (CMP) is used to remove excess materials from the stack. In one embodiment, the chemical metal polish (CMP) removes portions of the hard mask.

Although an embodiment of the invention and its advantages are described in detail, a person having ordinary skill in the art could make various alternations, additions, and omissions without departing from the spirit and scope of the present invention as defined by the appended claims.

What is claimed is:

1. A method of forming a via in an integrated circuit, comprising:

forming a stack including a first layer, a hard mask layer, and at least one intermediate layer disposed between the first layer and the hard mask layer, the first layer including a first metal line;

forming a channel in the hard mask layer, the channel having a first side and a second side opposite the first side;

forming a resist layer having an opening extending over both the first and second sides of the channel;

forming a metal line trench and a via opening aligned with the first and second sides of the channel; and filling the metal line trench and the via opening with a conductive material to create a second metal line and a via connecting the second metal line with the first metal line.

2. The method of claim 1, wherein forming a metal line trench and a via opening comprises:

performing at least one first etch process through the opening in the resist layer to form a via opening pilot aligned with the first and second sides of the channel;

removing the resist layer; and performing at least one second etch process to form the metal line trench and the via opening, the via opening being aligned with the via opening pilot.

3. The method of claim 1, wherein forming the stack comprises forming a dual damascene stack.

4. The method of claim 1, wherein each of the first and second etch processes are selective to an upper portion of the hard mask layer.

5. The method of claim 1, wherein the hard mask layer comprises a first hard mask layer and a second hard mask layer, and wherein forming a channel in the hard mask layer comprises forming a channel in the first hard mask layer.

6. The method of claim 1, wherein the width of the opening in the resist layer is greater than the width of the channel.

7. The method of claim 6, wherein the width of the opening in the resist layer is determined based on a potential amount of misalignment between the opening and the channel.

8. The method of claim 6, wherein the width of the opening is determined based on a potential amount of misalignment between the opening and the first metal line.

9. A method of forming a via in an integrated circuit, comprising:

forming a stack including a first layer, a hard mask layer, and at least one intermediate layer disposed between the first layer and the hard mask layer, the first layer comprising a first metal line and a second metal line;

forming a first channel and a second channel in the hard mask layer, each channel having a first side and a second side opposite the first side;

forming a resist layer having a first open region extending over the first and second sides of the first channel and a second open region extending over the first and second sides of the second channel;

forming a first metal line trench and via opening aligned with the first and second sides of the first channel and a second metal line trench and via opening aligned with the first and second sides of the second channel;

filling the first metal line trench and via opening to create a third metal line and a first via connecting the third metal line with the first metal line; and filling the second metal line trench and via opening to create a fourth metal line and a second via connecting the fourth metal line with the second metal line.

10. The method of claim 9, wherein forming a first metal line trench and via opening and a second metal line trench and via opening comprises:

performing at least one first etch process to form a first via opening plot aligned with the first and second sides of the first channel and a second via opening pilot aligned with the first and second sides of the second channel;

removing the resist layer; and performing at least one second etch process to form the first metal line trench and via opening and the second metal line trench and via opening, the first via opening being aligned with the first via opening pilot and the second via opening being aligned with the second via opening pilot.

11. The method of claim 9, wherein forming the stack comprises forming a dual damascene stack.

12. The method of claim 9, wherein the width of the first open region is greater than the width of the first channel.

13. The method of claim 12, wherein the width of the first open region is determined based on a potential amount of misalignment between the first open region and the first channel.

14. The method of claim 12, wherein the width of the first open region is determined based on a potential amount of misalignment between the first open region and the first metal line.

15. The method of claim 9, wherein forming a resist layer having a first open region and a second open region comprises forming a resist layer having an opening including both the first open region and the second open region.

16. The method of claim 15, wherein the opening extends beyond the first side of the first channel by a predetermined distance.

* * * * *